United States Patent

Allen et al.

(10) Patent No.: US 9,942,286 B2
(45) Date of Patent: Apr. 10, 2018

(54) COLLABORATION PLATFORM

(71) Applicant: Autodesk, Inc., San Rafael, CA (US)

(72) Inventors: Seth W. Allen, Boulder, CO (US);
Boris A. Sergeev, Boulder, CO (US);
James Michael Gordon, Superior, CO (US)

(73) Assignee: AUTODESK, INC., San Rafael, CA (US)

( * ) Notice: Subject to any disclaimer, the term of this patent is extended or adjusted under 35 U.S.C. 154(b) by 257 days.

(21) Appl. No.: 14/742,278

(22) Filed: Jun. 17, 2015

(65) Prior Publication Data

US 2015/0373068 A1 Dec. 24, 2015

Related U.S. Application Data

(60) Provisional application No. 62/015,223, filed on Jun. 20, 2014.

(51) Int. Cl.
*H04L 29/06* (2006.01)
*G06F 17/50* (2006.01)
*G06F 17/30* (2006.01)

(52) U.S. Cl.
CPC .... *H04L 65/4015* (2013.01); *G06F 17/30578* (2013.01); *G06F 17/5004* (2013.01)

(58) Field of Classification Search
None
See application file for complete search history.

(56) References Cited

U.S. PATENT DOCUMENTS

| | | | | |
|---|---|---|---|---|
| 6,073,177 A * | 6/2000 | Hebel | ............... | H04L 29/06 370/429 |
| 7,062,532 B1 * | 6/2006 | Sweat | ............... | G06Q 10/06 709/205 |
| 7,181,525 B1 * | 2/2007 | Hebel | ............... | G06Q 10/10 709/203 |
| 7,663,625 B2 * | 2/2010 | Chartier | ............ | G05B 19/41805 345/440 |
| 8,090,878 B2 * | 1/2012 | Pallipuram | ........ | G06F 17/30578 707/610 |
| 2012/0084212 A1 * | 4/2012 | Sinor | ............... | E21B 10/00 705/300 |
| 2012/0110595 A1 * | 5/2012 | Reitman | ............ | G06F 17/50 719/313 |

(Continued)

*Primary Examiner* — Thomas Dailey
(74) *Attorney, Agent, or Firm* — Gates & Cooper LLP (57) ABSTRACT

One or more embodiments of the invention provide a collaboration platform that permits multiple users to collaborate on multiple copies of a model simultaneously. The collaboration application provides a full set of two-dimensional (2D) and three-dimensional (3D) tools for a client to manipulate a model and transmit the results of such manipulations to a server. Both the clients and the server maintain a history of the manipulations results. Once object changes are received by the server from one or more clients, the server distributes the object changes to the remaining clients. Thereafter, the clients modify their local version of the model in accordance with the object changes received from the server. The history maintained by the clients or the server may then be used to undo or redo any of the object changes, or to rebuild a model space in the event of a network failure.

22 Claims, 4 Drawing Sheets

(56) References Cited

U.S. PATENT DOCUMENTS

2014/0278269 A1* 9/2014 Winn ...................... G06F 17/50
703/1
2014/0365182 A1* 12/2014 Marceau ............. G06F 17/5004
703/1

* cited by examiner

COLLABORATION PLATFORM

CROSS-REFERENCE TO RELATED APPLICATIONS

This application claims the benefit under 35 U.S.C. Section 119(e) of commonly-assigned U.S. Provisional Patent Application Ser. No. 62/015,223, filed on Jun. 20, 2014, by Boris A. Sergeev, James Michael Gordon and Seth W. Allen, entitled "COLLABORATION PLATFORM," which application is incorporated by reference herein.

This application is related to the following patent applications, which applications are incorporated by reference herein:

U.S. Utility patent application Ser. No. 13/925,475, filed on Jun. 24, 2014, by Ilai Rotbaein, Jonathan Mesh, Jonathan Seroussi, and David W. Arsenault, entitled "METHOD AND APPARATUS FOR DESIGN REVIEW COLLABORATION ACROSS MULTIPLE PLATFORMS";

U.S. Utility patent application Ser. No. 11/923,548, filed on Oct. 24, 2007, by Jacobo Bibliowicz, Carolyn Kreisel, Robert Lipari, and Ryan P. Rogers, entitled "COLLABORATION FRAMEWORK," now U.S. Pat. No. 8,024,661, issued Sep. 20, 2011, which is a continuation of U.S. Utility patent application Ser. No. 09/982,224, filed on Oct. 18, 2001; and U.S. Utility patent application Ser. No. 10/479,909, filed on Jun. 29, 2004, by Douglas G. Look, Lawrence D. Felser, and John R. Wallace, entitled "METHOD AND APPARATUS FOR PROVIDING ACCESS TO AND WORKING WITH ARCHITECTURAL DRAWINGS ON THE INTERNET," now U.S. Pat. No. 7,484,183, issued Jan. 27, 2009, which is based on PCT International Patent Application Serial No. PCT/US01/02310, filed on Jan. 24, 2001, which claims the benefit under 35 U.S.C. Section 119(e) of U.S. Provisional Patent Application Ser. No. 60/177,988, filed on Jan. 25, 2000.

BACKGROUND OF THE INVENTION

1. Field of the Invention

The present invention relates generally to computer-implemented drawing programs, and in particular, to a method, apparatus, and article of manufacture for multiple collaborators to simultaneously work on a model.

2. Description of the Related Art

The use of Computer Aided Design (CAD) modeling systems is well known in the art. CAD modeling systems are often expensive, complex, and difficult to learn how to use. Additionally, architects, contractors, engineers, owners, and other parties involved with a project are often mobile or at different locations. With new technology and the increased use of the Internet, project participants often have laptop computers, tablets, smartphones, and Internet access to the CAD modeling systems. However, the coordination and exchange of information between project participants can be increasingly complex.

Collaboration is well known, but traditional CAD modeling systems are generally limited to one user making model changes, regardless of the type of application: desktop, cloud, browser, etc.; or the type of interface: mouse and tool, keyboard, touch screen, etc. Collaboration is generally limited to viewing a model maintained by a server, and transmitting commands to modify the model from clients to the server, making sharing with other users, or allowing updates with other users, complex and difficult.

Accordingly, existing prior art applications do not provide the ability for multiple users to fully collaborate using locally and globally stored copies of a model with a full set of two-dimensional (2D) and three-dimensional (3D) modeling tools being used simultaneously with the model.

SUMMARY OF THE INVENTION

One or more embodiments of the invention provide a method, apparatus, and article of manufacture for a collaboration platform that permits multiple users to collaborate on multiple copies of a model simultaneously. Latency, which is usually an issue in collaboration systems, is mitigated by only transferring a minimal amount of transactional data back and forth between clients and servers, when a model is updated by any number of users.

The collaboration application provides a full set of 2D and 3D tools for a client to manipulate a model and transmit the results of such manipulations to a server. Both the clients and the server maintain a history of the manipulations results.

Once object changes are received by the server from one or more clients, each change is verified to be compatible with the server history and, if it is, the server distributes the accepted object changes to the remaining clients. Thereafter, the clients modify their local version of the model in accordance with the object changes. The history maintained by the clients or the server may then be used to undo or redo any of the object changes (e.g., object modifications made by another collaborator or themselves), or to rebuild a model space in the event of a network failure.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

A collaboration platform provides the ability for multiple users to simultaneously modify a model across a network using a full set of 2D and 3D tools. A client based application modifies its version of the model and generates transactions containing only object changes, which are stored in a history on the client and communicated across a network to a server based application that manages the collaboration session.

The server based application updates its version of the model with the object changes, stores the object changes in a history on the server, and then distributes the object changes to other client based applications. Both the client based application and the server based application maintain a history of object changes for undo and redo operations, as well as synchronization in the event of a network failure or outage.

Hardware and Software Environment

Figure 1:
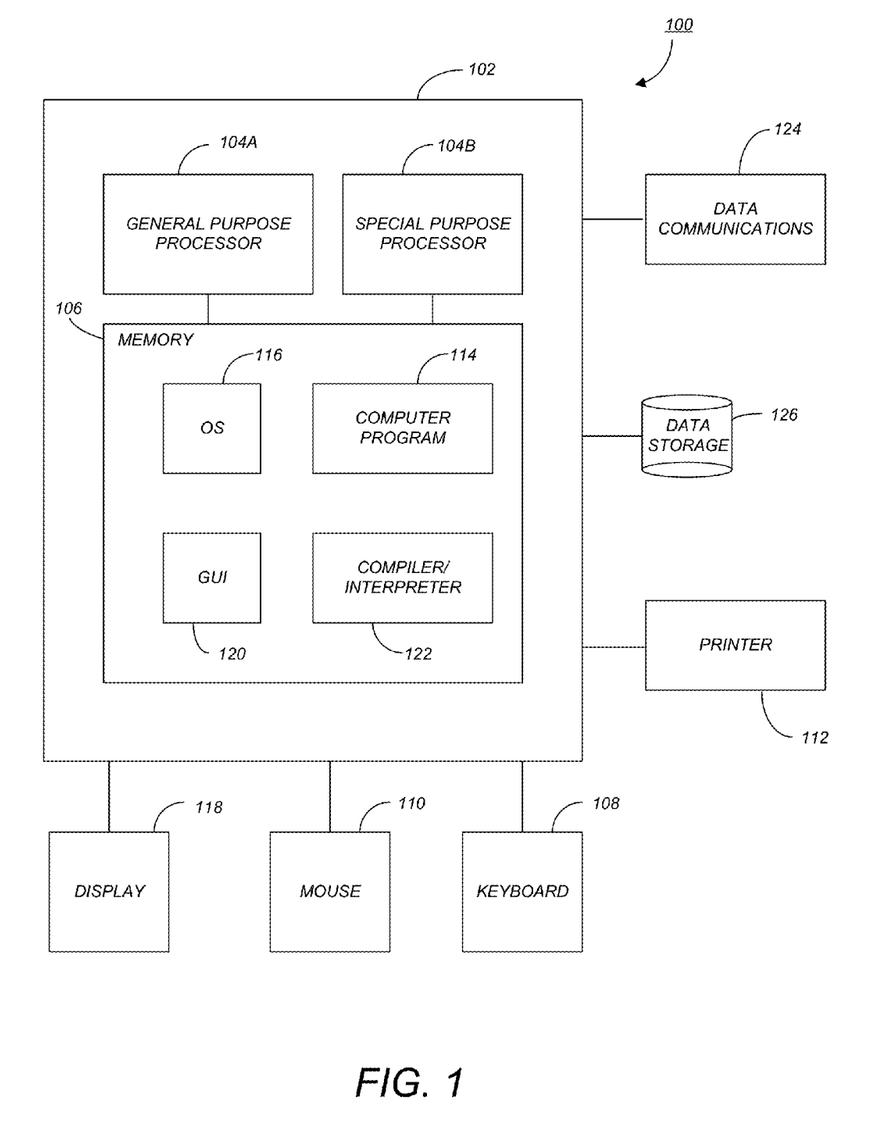
FIG. 1 schematically illustrates a hardware and software environment in accordance with one or more embodiments of the invention.

FIG. 1 is an exemplary hardware and software environment 100 used to implement one or more embodiments of the invention. The hardware and software environment includes one or more computers 102, wherein the computers 102 may be client computers or server computers. Each computer 102 may include a general purpose hardware processor 104A and/or a special purpose hardware processor 104B (hereinafter alternatively collectively referred to as processor 104) and a memory 106, such as random access memory (RAM). The computer 102 may be coupled to, and/or integrated with, other devices, including input/output (I/O) devices, such as a keyboard 108, a mouse or other cursor control device 110, and optionally a printer or other output device 112. In one or more embodiments, computer 102 may comprise any internet-enabled device.

In one embodiment, the computer 102 operates by the general purpose processor 104A performing instructions defined by the computer program 114 under control of an operating system 116. The computer program 114 and/or the operating system 116 may be stored in the memory 106 and may interface with the user and/or other devices to accept input and commands and, based on such input and commands and the instructions defined by the computer program 114 and operating system 116, to provide output and results.

Output/results may be presented on a display 118 or provided to another device for presentation or further processing or action. In one embodiment, the display 118 changes state to form all or part of an image in response to the data or information generated by the processor 104 based on the instructions of the computer program 114 and/or operating system 116. The image may be provided through a common graphical user interface (GUI) 120. Although the GUI 120 is depicted as a separate module, the instructions performing the GUI can be resident or distributed in the operating system 116, the computer program 114, etc.

Some or all of the operations performed by the computer 102 according to the computer program 114 instructions may be implemented in a special purpose processor 104B. In this embodiment, some or all of the computer program 114 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program 114 instructions.

The computer 102 may also implement a compiler/interpreter 122 that compiles the computer program 114 into processor 104 readable code for execution. Alternatively, the compiler/interpreter 122 interprets the computer program 114. When executed or interpreted, the computer program 114 accesses and manipulates data accepted from I/O devices and stored in the memory 106 of the computer 102 using the relationships and logic that were generated using the compiler/interpreter 122.

The computer 102 also includes a data communications device 124, for accepting input from, and providing output to, a data communications network. Using the network, the computer 102 may interact with other devices.

In one embodiment, instructions, logic and/or data implementing the operating system 108, the computer program 114, and the compiler/interpreter 122 are tangibly embodied in a non-transitory computer-readable medium, e.g., a data storage device 126, which may be one or more fixed or removable data storage devices. Further, the operating system 108, the computer program 114, and the compiler/interpreter 122 are comprised of instructions, logic and/or data which, when accessed, read and executed or interpreted by the computer 102, cause the computer 102 to perform the steps necessary to implement and/or use the present invention or to load the program of instructions into a memory 106, thus creating a special purpose data structure causing the computer 102 to operate as a specially programmed computer executing the method steps described herein. The operating system 108, the computer program 114, and the compiler/interpreter 122 may also be tangibly embodied in memory 106 and/or accessible via the data communications device 124, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 102.

Client/Server Architecture

Figure 2:
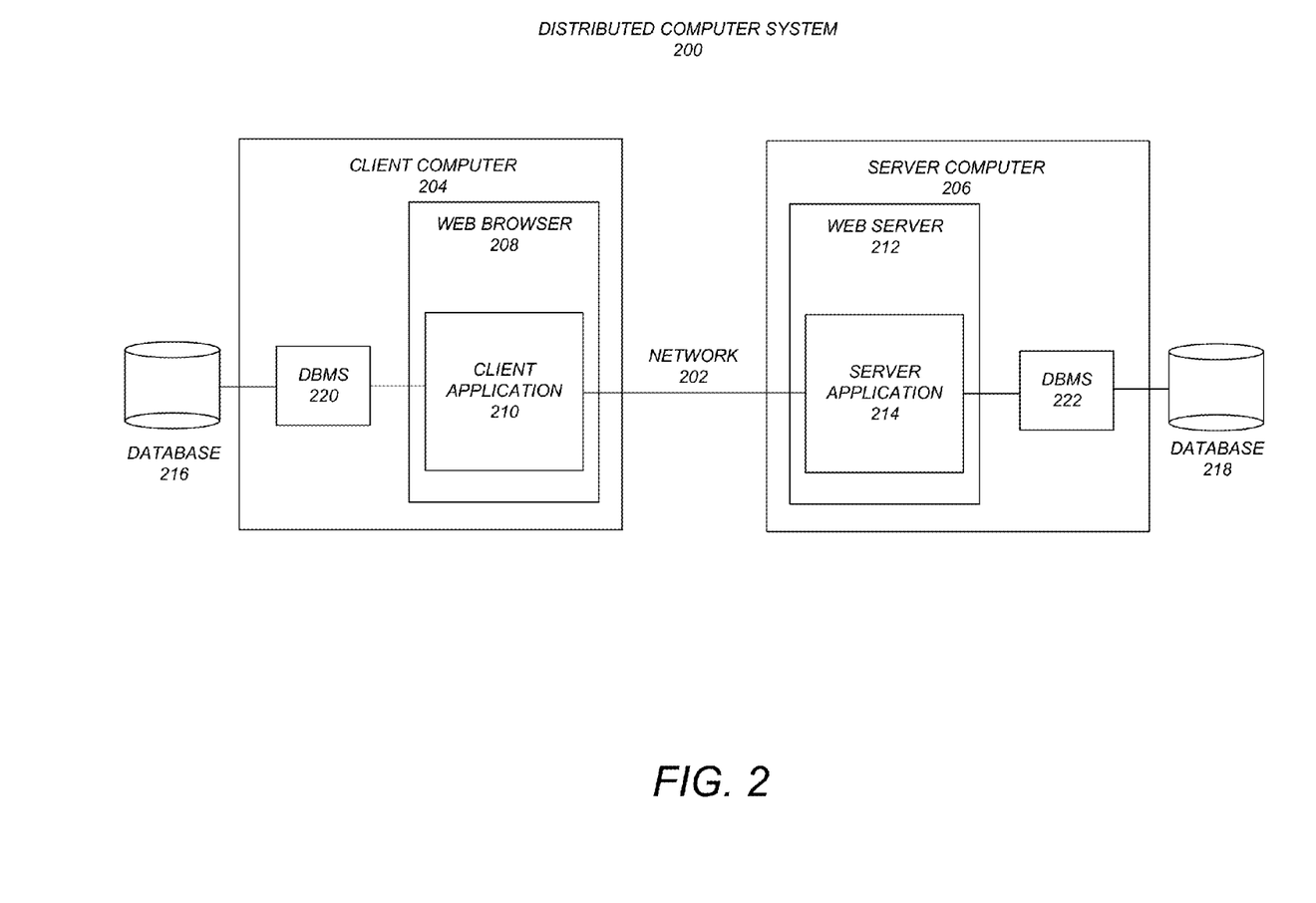
FIG. 2 schematically illustrates a typical distributed computer system using a network to connect one or more client computers to one or more server computers in accordance with one or more embodiments of the invention.

FIG. 2 schematically illustrates a typical distributed computer system 200 using a network 202 to connect one or more client computers 204 to one or more server computers 206. A typical combination of resources may include a network 202 comprising the Internet, LANs (local area networks), WANs (wide area networks), mobile networks, or the like; client computers 204 that are workstations, personal computers, laptops, tablets, smartphones, etc. (as set forth in FIG. 1); and server computers 206 that are mainframes, minicomputers, rack-mounted server appliances, workstations, personal computers, etc. (as set forth in FIG. 1).

Client computers 204 may execute a web browser 208, which in turn performs a client application 210, while server computers 206 may execute a web server 212, which in turn performs a server application 214. The server application 214 may be a software framework that provides both facilities to create web applications and to run them. The client application 210 may be downloaded from the server computer 206, as a script, plug-in, add-in or the like, for execution by the web browser 208. Alternatively, the client application 210 may comprise a desktop application, a mobile application, etc. Both the client application 210 and server application 214 may store data in their respective databases 216, 218 using their respective database management systems (DBMS) 220, 222.

Generally, in accordance with FIG. 1, components 202-206 are hardware and components 208-218 are software, wherein the hardware comprises electronic devices and the software comprises instructions, logic and/or data that is tangibly embodied in and/or retrievable from a device, medium, signal, or carrier, e.g., a data storage device, a data communications device, a remote computer or device coupled to the computer via a network or via another data communications device, etc. Moreover, these instructions, logic and/or data, when read, executed, and/or interpreted, results in the functions and steps necessary to make and/or use the present invention.

Of course, those skilled in the art will recognize that any combination of the above components, or any number of different components, may be used to implement the present invention.

Modeling Application

In one or more of the embodiments of the invention, the client and server applications 210, 214 together comprise the Autodesk® FormIt® 360 and Autodesk® FormIt® 360 Pro product (hereinafter referred to collectively as FormIt® 360), which is a modeling client application 210 downloaded to the client computer 204 for execution from a cloud-based modeling server application 214 executed on the server computer 206. FormIt® 360 is used to create conceptual designs.

For example, FormIt® 360 may be used to capture building design concepts when ideas occur, such as when walking a building site. Those ideas are created in a portable digital format that can use real-world site information, such as satellite images, to orient the designs. Real building and environmental data can be used to support design brainstorming. Preliminary designs can then be moved to centralized data storage for access and refinement in Autodesk® Revit® software or other applications.

The designs are captured and stored as models in a database, both on the client computer 204 (e.g., database 216) and/or the server computer 206 (e.g., database 218). These databases 216, 218 can then be queried and accessed to find and retrieve one or more models based on various search criteria.

User Interaction

FormIt® 360 is based on a Web Sketch modeler (WSM), which is a polyhedral geometric modeling kernel and collaboration platform. The user interface for FormIt®0 360 makes use of a particular hardware and software environment's standard interaction model. However, the capabilities of the FormIt® 360 user interface are common across all platforms.

Generally, FormIt® 360 allows a user to sketch or place geometric shapes onto a display. The user can import 2D and 3D models and images, or create such models using 2D and 3D geometry creation tools.

For example, the user interface provides functions for sketching 2D shapes or placing 3D primitives, or by importing geometry. Then, the user can modify their designs, by pushing and pulling faces, by using various transform tools and Boolean operations, and by other means.

The types of 2D tools that the user can sketch with may include: Lines, Arcs, Splines, Rectangles, and Circles, as well as other 2D tools, which are used to create shapes that the user can combine into building designs. The user creates shapes by clicking on a tool from a Sketch toolbar. Then, the user clicks in the view to define the shape.

The types of 3D primitives that the user can place may include: Cubes, Domes, Cylinders, Prisms, and Pyramids, as well as other 3D primitives, which are used as design building blocks. The user can place primitives by clicking on a Geometry Creation toolbar. Then, the user clicks in the view to place the primitives.

To create more complex designs after sketching a shape or placing a primitive, the user can use several contextual tools to modify their design. For example, the user can manipulate objects using operations that may include: Select, Delete, Move, Scale, Rotate, Extrude, Cut Face, Offset Face, Tilt, Copy/Paste, Array, Cover, Sweep, Loft, and Boolean Cut and Join, as well as other operations.

In this way, objects can be manipulated using snaps and inferences; choosing an object or surface; selecting similar objects; removing an object, changing its location, or modifying its properties; enclosing open edges, making geometry changes along a path of edges, and connecting multiple profiles or edges; examining, setting and modifying object properties; etc.

FormIt® 360 also provides the following functions:

The user can define a geographic location, for example, by importing and editing satellite images or geometry, to make use of building performance and climate data with their designs.

The user can add and edit ground overlays and other images, and specify a vertical order, to add clarity and realism to a design.

The user can choose a visual appearance style that best suits their purpose, including the display of ambient shadows, hidden/sketchy lines, grid display/units, and levels.

The user can create and modify materials, and apply materials to faces or entire objects, to add detail to the geometry in their sketch.

The user can bundle together one or more objects into groups that the user can more easily manipulate.

The user can create a Building Information modeling (BIM) workflow by evaluating the performance of elements from the beginning of the design process.

The user can specify multiple data formats to preserve and share their designs, including saving files to cloud or local storage, and exporting files.

FormIt® 360 also provides additional features, including real-time collaboration.

Real-Time Collaboration

FormIt® 360 allows a host user (on a first client computer 204, which initiates the collaborative session) to work simultaneously with guest users (on other client computers 204) on the same design or model stored on the server computer 206. Specifically, the host user can start a collaboration session and let the guest users see their design, see any edits the host user makes, and see any edits the guest users make.

Collaboration functions include, but are not limited to, the following:

Start and stop collaborative sessions,
Invite other people to join a session,
Join a session,
Follow another user's camera,
See other user's model element selections, and
Chat with collaborators within a session.

FormIt® 360 provides for a simultaneous modifications workflow. Imagine a group of architects at distributed locations simultaneously working on the same building and site plan. One architect could be modifying an atrium, while another is modifying a facade, and another one is changing the stairs. All the architects can see each others' changes in real time, as they are made. This is accomplished by each client computer 204 only sending the minimum set of data describing the changes that user made to a much larger common model to the server computer 206 for distribution to other client computers 204. In particular, the full model will never need to be passed between the client computers 204 and server computers 206.

FormIt® 360 also optimizes data to minimize the amount of network 202 traffic. Localized modifications of even a big model on a client computer 204 results in the transmission of the minimal set of changes to the server computer 206, which is sufficient for applying these changes on a previous state of the model stored on the server computer 206 or another client computer 204. For example, modifying the roof of a multi-story building model results in the transmission only of the data for the new roof and adjacent geometry, while none of the unchanged model elements are included into transmission.

Specifically, if a user modifies a model, e.g. extrudes a 2D square into a 3D object, only the resulting geometrical changes, topological changes, or both geometrical and topological changes, are sent in a single transaction by the client computer 204 to the server computer 206 or other client computers 204. The results of the operation and not the operation itself is transacted, i.e., the operation is not replayed on the server computer 206 or other client computers 204, but the results of the operation, broadcast as a single transaction, are directly applied to the current history on each system. All the client computers 204 and server computers 206 participating in the sharing session have the same transactional history of the model.

Collaboration Platform

The collaboration platform embodied in the WSM provides for robust collaboration that is substantially immune to network 202 latency and capable of resolving conflicting changes made by collaborators simultaneously editing the same model.

The WSM represents a model as an ordered sequence of object changes, wherein the object changes are referred to as deltas and the ordered sequence is referred to as a history.

Each delta is a result of some modeling operation generating changes to one or more objects (i.e., elements) in the model. However, the delta does not describe the operation; instead, it provides a minimal representation of model changes: a list of objects (Vertices, Faces, Edges, etc.) of the model whose state was changed by the modeling operation. Essentially, model construction is performed by applying deltas, one after another, in an ordered sequence. The origin of these deltas, whether produced by a modeling operation on the client computer 204 or received from the collaboration server computer 206, is unimportant.

Each collaboration session is managed by the server computer 206, which acts as a collaboration server and maintains a "session" history. Upon connection, each new client computer 204 joining the session is initialized by the server computer 206 with the current state of the model by downloading the history from the server computer 206 to the client computer 204. Thereafter, the history maintained by the client computer 204 is kept in synchronization with the history maintained by the server computer 206.

Only model changes (deltas) are broadcast between the client computers 204 and server computer 206, which reduces network 202 traffic and ensures real-time updates. The server computer 206 accepts or rejects changes from collaborating client computers 204 based on the delta ID associated with the changed object, such that the first change in time is accepted and later changes in time are rejected.

Conflicting changes are resolved by the client computer 204 whose delta submission was rejected by the server computer 206.

Unrelated changes to different objects can be resolved automatically (by updating IDs of newly created objects), while changes to same objects may require user interaction.

deltas can be self-sufficient, i.e., they may not impose any requirements on the pre-existing model for their successful application (e.g. placing a block can be done in any state of the model). Alternatively, a delta can have a clear set of pre-requisites for its application (e.g. adding a hole to a block can only be done if the block exists).

The WSM determines the relationship between deltas, as well as checks whether a certain delta can be successfully applied to the existing model. All objects of a model are referenced by their object ID and determining whether two sets of changes affect the same object becomes as simple as finding an intersection of two sets of object IDs. Each delta is also assigned a monotonically increasing ID, so comparing IDs of two deltas establishes their order.

Delta IDs and object IDs are only unique within a given model. If several users are participating in a collaborative session modifying the same model, they can temporarily run into a state where models on different client computers 204 contain different deltas or objects with the same IDs. This can happen because the collaboration server computer 206 does not provision the client computers 204 with non-conflicting session-unique IDs. Instead, the server computer 206 marks the first incoming deltas and their objects as "accepted", while their IDs are unique to the model maintained by the server computer 206. Deltas with conflicting IDs received by the server computer 206 later are rejected and it becomes the responsibility of the client computers 204 who sent the deltas to reconcile their conflicting IDs.

Server Operation

During collaboration, new deltas resulting from some modeling operation performed by each user are serialized by the client computer 204, enclosed in a suitable network 202 package, and sent to the collaboration server computer 206. By examining an incoming delta, the server computer 206 makes a computationally inexpensive determination whether this delta can be applied on the existing model maintained by the server computer 206. If the delta is compatible with the model, the model is updated by applying the delta and the client computer 204 that originated this delta is notified of its acceptance. If the delta cannot be applied to the model (e.g. because this delta was produced before the server computer 206 accepted another, perhaps conflicting, delta from a different collaborator), a message is sent to the client computer 204 that originated this delta that it was rejected. It becomes the responsibility of the client computer 204 that originated this delta to either reconcile this delta with other deltas already accepted by the server computer 206 and later re-send a modified one, or discard this change altogether, due to already accepted conflicting changes from other collaborators (e.g. somebody deleted a block, where the user tried to add a hole; since the whole block has disappeared, the hole is discarded).

The server computer 206 processes incoming deltas in the order of their arrival: among several deltas coming from different client computers 204 and compatible with the model stored by the server computer 206, the first delta gets accepted. Since network 202 performance and timing of the client computers 204 receiving deltas broadcast by the server computer 206 is unpredictable, the server computer 206 does not make any assumption of the non-conflicting state of the model on the different client computers 204, and does not attempt to ensure its non-conflicting state (e.g. by issuing session-unique IDs, which alone are insufficient to ensure the compatibility of deltas from different client computers 204).

Client Operation

When a user joins a non-empty collaborative session (i.e., a session with an associated non-empty model stored by the server computer 206), their client computer 204 deletes the local model and replicates the session's model by receiving the session history comprised of an ordered sequence of deltas from the server computer 206. After these deltas are applied to create the model maintained by the client computer 204, it becomes identical to the model maintained by the server computer 206 at the moment the server computer 206 sent the initial session history to the client computer 204.

When the user makes changes to their local model, the corresponding deltas are serialized and queued for submission to the server computer 206, and are sent out one-by-one by the client computer 204. After submission of the first delta, the client computer 204 waits for feedback from the server computer 206, i.e., either this delta is accepted (in which case it is deleted from the outgoing queue of the client computer 204), or this delta is rejected. If the delta is rejected, the client computer 204 waits for other users' deltas to be received from the server computer 206, which deltas have already been accepted by the server computer 206, and then inserts the other users' deltas into its history of the model ahead of any other local deltas waiting to be applied to the model.

Figure 3A:
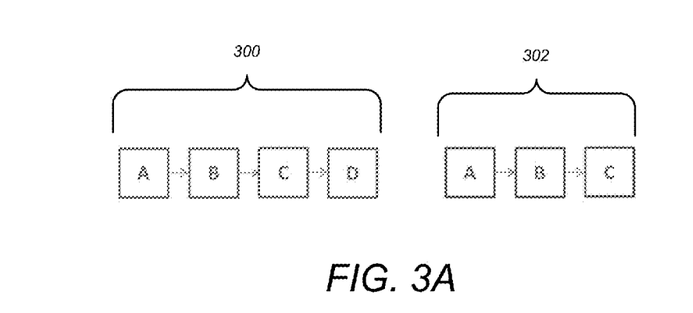
FIGS. 3A, 3B and 3C are diagrams that illustrate how histories are maintained by a client and server in accordance with one or more embodiments of the invention.
Figure 3B:
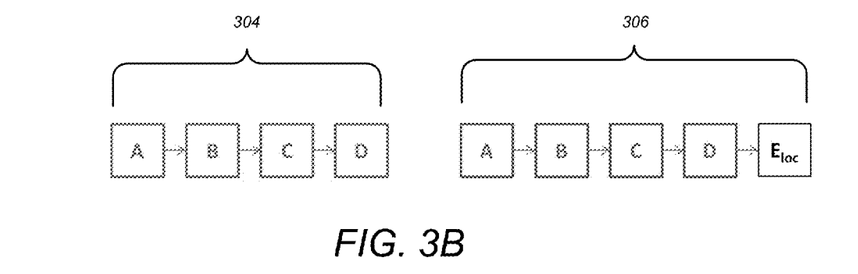
Figure 3C:
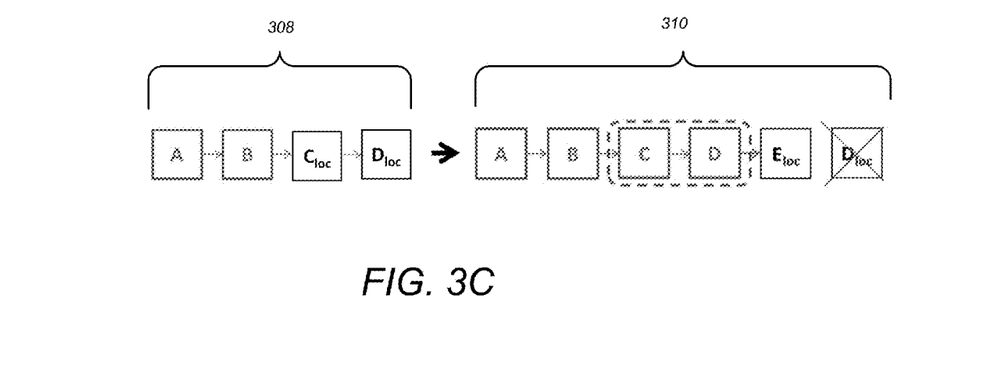

FIGS. 3A, 3B and 3C are diagrams that illustrate the interaction between the history maintained by the client computer 204 and the history maintained by the server computer 206, according to one or more embodiments of the invention. At any given time, the history maintained by the client computer 204 may deviate from the "session" history maintained by the server computer 206. This is described in more detail below.

1. In FIG. 3A, blocks 300 represent the sequence of operations (A,B,C,D) in the history of the server computer 206 at some point in time, while blocks 302 represent the sequence of operations (A,B,C) in the history of the client computer 204. The client computer 204 may not yet have received, and applied, changes (D) from other client computers 204 by way of the server computer 206, which have already been accepted by the server computer 206 (but they will eventually be received and applied).
2. In FIG. 3B, blocks 304 represent the sequence of operations (A,B,C,D) in the history of the server computer 206, while blocks 306 represent the sequence of operations (A,B,C,D,$E_{loc}$) in the history of the client computer 204. The client computer 204 has local changes ($E_{loc}$) not yet sent to the server computer 206.
3. In FIG. 3C, blocks 308 represent the sequence of operations (A,B,$C_{loc}$,$D_{loc}$) in the history of a client computer 204 before it receives changes C and D from the server computer 206, while blocks 310 represent the sequence of operations (A,B,C,D,$E_{loc}$, and deleted $D_{loc}$) in the history of the client computer 204 after processing the changes received from the server computer 206. The client computer 204 may have both "not yet received" deltas (C,D) and "not yet sent" deltas ($C_{loc}$,$D_{loc}$). Changes by the server computer 206 (C,D) will be inserted in front of the local deltas ($C_{loc}$,$D_{loc}$) in the history of the client computer 204 (as indicated by the dashed-line box), and local deltas (C',D') may be modified ($C_{loc}$ renamed to $E_{loc}$) or discarded (as indicated by the crossed-out $D_{loc}$) as a result of applying the server deltas (C, D). The IDs of the local deltas ($C_{loc}$) and their model objects may be incremented, if they conflict with those deltas (C,D) accepted by the server computer 206.

Note that, in #3 above, when the client computer 204 has not yet accepted the local deltas (C',D') and receives deltas ($C_{loc}$,$D_{loc}$) already accepted by the server computer 206, i.e., changes from other client computers 204. This is a typical situation for collaborative sessions with multiple users actively modifying the model at the same time. One of the important differences of the WSM collaboration platform is the ability of each client computer 204 to handle this situation and reconcile local deltas and server-accepted deltas efficiently and in a manner transparent to the user.

This is achieved by establishing a relationship between deltas based on the IDs of the objects they contain. The relationship between deltas can be:

Unrelated—two users were changing different and unrelated objects of the model and their deltas contain no common IDs.

Reconcilable—the later delta created new objects, whose IDs clash with the IDs of objects from earlier deltas. In this case, IDs of the new objects can be incremented to avoid the ID collision.

Incompatible—the later delta modifies objects, which were deleted or modified in the earlier delta.

Based on the relationship between the incoming deltas already accepted by the server computer 206 and the local deltas, the client computer 204 incorporates the incoming deltas into its model and reduces the model discrepancy found in #3 above, not all deltas received and not all deltas sent, found in #2 above, and then continues sending local deltas to the server computer 206.

Advantages and Benefits

The main advantages of the collaboration platform of this invention over existing collaborative frameworks are:

1. The collaboration platform of this invention includes "thick" client computers 204 performing all modeling operations and a "thin" server computer 206 verifying the compatibility of the model changes made by the client computers 204 with the session's model maintained by the server computer 206. Collaboration data transmitted between the server computer 206 and the client computers 204 include deltas, which are the results of modeling operations, not the operation themselves.
2. The collaboration platform of this invention implements transactional modifications to a model. Each such transaction is described by a delta comprised of a minimal set of changes to the objects identified by IDs unique within the model. Based on these IDs, the collaboration platform of this invention implements an efficient comparison of the ordered deltas and makes a determination whether a delta can be applied to the model.
3. The server computer 206 receives deltas from client computers 204 participating in a collaborative session and only performs a computationally inexpensive comparison of the IDs of a delta and objects it contains, in order to determine if the delta should be accepted or rejected. All computationally intensive operations of model modification are performed by the client computers 204 and only the concise results of these modifications are sent to the server computer 206. This facilitates scaling collaborative sessions without overloading the server computer 206, while ensuring real time interaction transparent to the users.

4. Each client computer 204 communicates with the server computer 206 by sending its local changes to the server computer 206 and applying already-accepted changes from other client computers 204, which are received from the server computer 206. The asynchronous nature of such interactions often results in a situation where deltas received from the server computer 206 are applied to a model before local deltas, and the local deltas may be modified or discarded.

Flowchart

Figure 4:
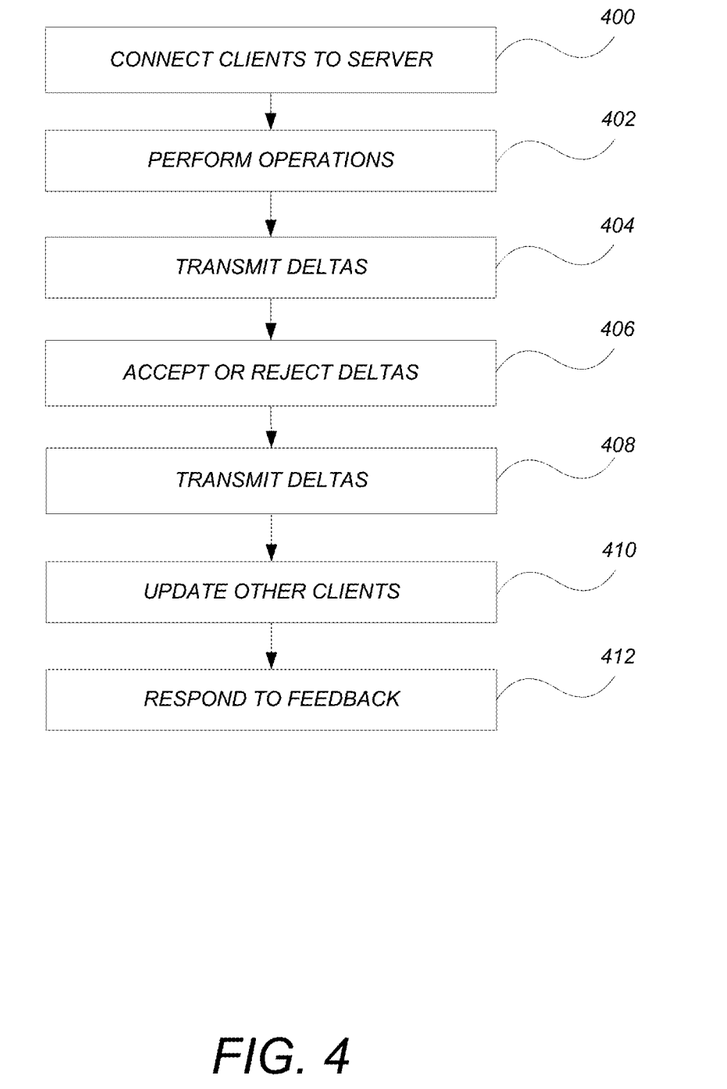
FIG. 4 is a flow chart illustrating the use of the collaboration platform in accordance with one or more embodiments of the invention.

FIG. 4 is a flowchart illustrating the use of the collaboration platform in accordance with one or more embodiments of the invention. Specifically, the flowchart illustrates the steps and functions performed by a system for collaborating among computers, according to one or more embodiments of the invention.

Block 400 represents one or more client computers 204 connecting to a server computer 206 coupled via a communications network 202. Specifically, this block represents the client computers 204 joining a session managed by the server computer 206. Upon joining a session, the client computers 204 are initialized by the server computer 206 with a current state of a model by downloading a history from the server computer 206 to the client computers 204.

Thereafter, the server computer 206 and the client computers 204 each maintain a copy of a model comprised of a graphical design, wherein the graphical design is composed of 2D and/or 3D objects. Moreover, the server computer 206 and the client computers 204 each maintain a history of changes made to the model, wherein the history is an ordered sequence of one or more deltas containing only results of the operations making modifications to the objects of the model, but not the operations themselves. The server computer 206 and the client computers 204 use the history of changes made to the model to undo or redo the operations making modifications made to the objects.

Block 402 represents at least one of the client computers 204 performing operations making modifications to the model. Not only are one or more objects of the model modified, but this block also results in deltas being generated.

As noted above, each of the deltas comprises a list of the objects whose state was changed by one of the operations. Specifically, the modified objects resulting from the operations are stored in the deltas. In one embodiment, the results of the operations comprise a minimal set of changes sufficient for altering a previous state of the copy of the model maintained on the server computer 206 to match a current state of the copy of the model maintained on the at least one of the client computers 204.

Block 404 represents the at least one of the client computers 204 transmitting only the deltas to the server computer 206 to update the copy of the model maintained by the server computer 206, in order to reflect changes made to the copy of the model maintained by the at least one of the client computers 204. The at least one of the client computers 204 serializes the deltas before the deltas are transmitted to the server computer 206, wherein, after transmitting a first one of the deltas, the at least one of the client computers 204 waits for feedback from the server computer 206.

Block 406 represents the server computer 206 accepting or rejecting the transmitted deltas, and responding with feedback to the at least one of the client computers 204 accordingly. If the delta is accepted, then the copy of the model and the history maintained by the server computer 206 is updated using only the accepted deltas, but not by replaying the operations making modifications to the objects.

In addition, the server computer 206 also maintains a history of changes made to the model, wherein the history is an ordered sequence of one or more deltas containing only results of operations making modifications to the objects, but not the operations themselves. If the delta is accepted, then the history maintained by the server computer 206 is also updated using only the accepted deltas.

The server computer 206 accepts or rejects changes from the at least one of the client computers 204 based on a delta ID associated with the object that was modified, such that a first change in time is accepted and one or more later changes in time are rejected. Generally, the at least one of the client computers 204 resolves conflicting changes when the deltas are rejected by the server computer 206. On the other hand, other conflicting changes can be resolved by the server computer 206. For example, unrelated changes to different objects are resolved automatically by updating object IDs of newly-created objects.

The deltas may be self-sufficient in that they do not impose any requirements on the model as it exists for their successful application to the model. Alternatively, the deltas may have a set of pre-requisites for their application to the model. The server computer 206 determines a relationship between the deltas, and checks whether the deltas can be successfully applied to the copy of the model maintained by the server computer 206.

For example, the objects are referenced by an object ID, and the server computer 206 determines whether two or more of the changes affect the same object by finding an intersection between the object IDs.

On the other hand, the deltas are each assigned a monotonically increasing delta ID, so that comparing the delta IDs of two or more of the deltas establishes their order. Consequently, a first one of the deltas received by the server computer 206 may be accepted and a later one or more of the deltas with a delta ID conflicting with a delta ID of the first one of the deltas may be rejected.

The server computer 206 also establishes the relationship between the deltas based on object IDs of the objects contained within the deltas, such that:

- the relationship between the deltas is unrelated when the deltas contain no common object IDs, and the deltas are accepted;
- the relationship between the deltas is reconcilable when a later one of the deltas includes one or more new objects whose object IDs conflict with object IDs of one or more existing objects created by an earlier one of the deltas, the object IDs of the one or more new objects are incremented to avoid the conflict, and the deltas are accepted; and
- the relationship between the deltas is incompatible when a later one of the deltas modifies one or more of the objects that were deleted or modified in an earlier one of the deltas, and the later one of the deltas is rejected.

Block 408 represents the server computer 206 transmitting only the accepted deltas to one or more others of the client computers 204 to update the copy of the model maintained by the one or more others of the client computers 204, in order to reflect changes made to the copy of the model maintained by the server computer 206.

Block 410 represents the one or more others of the client computers 204 updating the copy of the model and the history maintained by the one or more others of the client computers 204 using only the accepted deltas transmitted by the server computer 206, but not by replaying the operations making modifications to the objects.

Block 412 represents the at least one of the client computers 204 responding to the feedback from the server computer 206. When the feedback indicates that the first one of the deltas was accepted, the at least one of the client computers 204 sends a subsequent one of the deltas. When the feedback indicates that the first one of the deltas was rejected, the at least one of the client computers 204 waits for deltas from the one or more others of the client computers 204 to be received from the server computer 206, and then inserts the deltas from the one or more other of the client computers 204 into the history maintained by the at least one of the client computers 204 ahead of any local ones of the deltas waiting to be transmitted to the server computer 206, and reconciles the deltas from the one or more other of the client computers 204 and the local ones of the deltas.

CONCLUSION

This concludes the description of the preferred embodiment of the invention. The following describes some alternative embodiments for accomplishing the present invention. For example, any type of network, such as Internet, LANs (local area networks), WANs (wide area networks), mobile networks, or the like may be used with the present invention. Moreover, any type of computer, such as mainframes, minicomputers, rack-mounted server appliances, workstations, personal computers, laptops, tablets, smartphones, or the like, may be used with the present invention.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A system for collaborating among computers, comprising:
   a server computer coupled via a communications network to one or more client computers, wherein:
   the server computer and the client computers each maintain a copy of a model comprised of a graphical design, wherein the graphical design is composed of two-dimensional (2D) and/or three-dimensional (3D) objects;
   the server computer and the client computers each maintain a history of changes made to the model, wherein the history is comprised of one or more deltas containing only results of operations making modifications to the objects, but not the operations themselves;
   at least one of the client computers transmits only the deltas to the server computer to update the copy of the model maintained by the server computer, in order to reflect changes made to the copy of the model maintained by the at least one of the client computers; and
   the server computer accepts or rejects the transmitted deltas based on delta IDs associated with the objects that were modified, updates the copy of the model and the history maintained by the server computer using only the accepted deltas, but not by replaying the operations making modifications to the objects, and then transmits only the accepted deltas to one or more others of the client computers to update the copy of the model maintained by the one or more others of the client computers, in order to reflect changes made to the copy of the model maintained by the server computer.

2. The system of claim 1, wherein the history comprises an ordered sequence of the deltas.

3. The system of claim 1, wherein the one or more others of the client computers update the copy of the model and the history maintained by the one or more others of the client computers using only the accepted deltas transmitted by the server computer, but not by replaying the operations making modifications to the objects.

4. The system of claim 1, wherein the server computer and the client computers use the history of changes made to the model to undo or redo the operations making modifications made to the objects.

5. The system of claim 1, wherein, upon joining a session, the client computers are initialized by the server computer with a current state of the model by downloading the history from the server computer to the client computers.

6. The system of claim 1, wherein the server computer accepts or rejects changes from the at least one of the client computers based on the delta IDs associated with the objects that were modified, such that a first change in time is accepted and one or more later changes in time are rejected.

7. The system of claim 1, wherein the at least one of the client computers resolves conflicting changes when the deltas are rejected by the server computer.

8. The system of claim 1, wherein unrelated changes to different objects are resolved automatically by updating object IDs of newly-created objects.

9. The system of claim 1, wherein the deltas have a set of pre-requisites for their application to the model.

10. The system of claim 1, wherein the server computer determines a relationship between the deltas, and checks whether the deltas can be successfully applied to the copy of the model maintained by the server computer.

11. The system of claim 10, wherein each of the objects are referenced by an object ID, and the server computer determines whether two or more of the changes affect a same one of the objects by finding an intersection between the object IDs.

12. The system of claim 10, wherein the deltas are each assigned a monotonically increasing one of the delta IDs, so that comparing the delta IDs of two or more of the deltas establishes their order.

13. The system of claim 12, wherein a first one of the deltas received by the server computer is accepted and a later one or more of the deltas received by the server computer is rejected, when the delta IDs are conflicting.

14. The system of claim 10 wherein the server computer establishes the relationship between the deltas based on object IDs of the objects contained within the deltas, such that:
   the relationship between the deltas is unrelated when the deltas contain no common object IDs, and the deltas are accepted;
   the relationship between the deltas is reconcilable when a later one of the deltas includes one or more new objects whose object IDs conflict with object IDs of one or more existing objects created by an earlier one of the deltas, the object IDs of the one or more new objects are incremented to avoid the conflict, and the deltas are accepted; and
   the relationship between the deltas is incompatible when a later one of the deltas modifies one or more of the objects that were deleted or modified in an earlier one of the deltas, and the later one of the deltas is rejected.

15. The system of claim 1, wherein the at least one of the client computers serializes the deltas before the deltas are transmitted to the server computer.

16. The system of claim 15, wherein:
after transmitting a first one of the deltas, the at least one of the client computers waits for feedback from the server computer, such that:
when the feedback indicates that the first one of the deltas was accepted, the at least one of the client computers sends a subsequent one of the deltas; and
when the feedback indicates that the first one of the deltas was rejected, the at least one of the client computers waits for deltas from the one or more others of the client computers to be received from the server computer, and then inserts the deltas from the one or more other of the client computers into the history maintained by the at least one of the client computers ahead of any local ones of the deltas waiting to be transmitted to the server computer and reconciles the deltas from the one or more other of the client computers and the local ones of the deltas.

17. A method for collaborating among computers, comprising:
coupling one or more client computers to a server computer via a communications network, wherein:
the client computers and the server computer each maintain a copy of a model comprised of a graphical design, wherein the graphical design is composed of two-dimensional (2D) and/or three-dimensional (3D) objects;
the client computers and the server computer each maintain a history of changes made to the model, wherein the history is comprised of one or more deltas containing only results of operations making modifications to the objects, but not the operations themselves;
at least one of the client computers transmits only the deltas to the server computer to update the copy of the model maintained by the server computer, in order to reflect changes made to the copy of the model maintained by the at least one of the client computers; and
the server computer accepts or rejects the transmitted deltas based on delta IDs associated with the objects that were modified, updates the copy of the model and the history maintained by the server computer using only the accepted deltas, but not by replaying the operations making modifications to the objects, and then transmits only the accepted deltas to one or more others of the client computers to update the copy of the model maintained by the one or more others of the client computers, in order to reflect changes made to the copy of the model maintained by the server computer.

18. An article of manufacture comprising a non-transitory program storage medium readable by a computer and tangibly embodying one or more instructions executable by the computer to perform a method for collaborating among computers, the method comprising:
coupling one or more client computers to a server computer via a communications network, wherein:
the client computers and the server computer each maintain a copy of a model comprised of a graphical design, wherein the graphical design is composed of two-dimensional (2D) and/or three-dimensional (3D) objects;
the client computers and the server computer each maintain a history of changes made to the model, wherein the history is comprised of one or more deltas containing only results of operations making modifications to the objects, but not the operations themselves;
at least one of the client computers transmits only the deltas to the server computer to update the copy of the model maintained by the server computer, in order to reflect changes made to the copy of the model maintained by the at least one of the client computers; and
the server computer accepts or rejects the transmitted deltas based on delta IDs associated with the objects that were modified, updates the copy of the model and the history maintained by the server computer using only the accepted deltas, but not by replaying the operations making modifications to the objects, and then transmits only the accepted deltas to one or more others of the client computers to update the copy of the model maintained by the one or more others of the client computers, in order to reflect changes made to the copy of the model maintained by the server computer.

19. The method of claim 17, wherein the deltas are each assigned a monotonically increasing one of the delta IDs, so that comparing the delta IDs of two or more of the deltas establishes their order.

20. The method of claim 19, wherein a first one of the deltas received by the server computer is accepted and a later one or more of the deltas received by the server computer is rejected, when the delta IDs are conflicting.

21. The method of claim 17 wherein the server computer establishes the relationship between the deltas based on object IDs of the objects contained within the deltas, such that:
the relationship between the deltas is unrelated when the deltas contain no common object IDs, and the deltas are accepted;
the relationship between the deltas is reconcilable when a later one of the deltas includes one or more new objects whose object IDs conflict with object IDs of one or more existing objects created by an earlier one of the deltas, the object IDs of the one or more new objects are incremented to avoid the conflict, and the deltas are accepted; and
the relationship between the deltas is incompatible when a later one of the deltas modifies one or more of the objects that were deleted or modified in an earlier one of the deltas, and the later one of the deltas is rejected.

22. The method of claim 17, wherein:
after transmitting a first one of the deltas, the at least one of the client computers waits for feedback from the server computer, such that:
when the feedback indicates that the first one of the deltas was accepted, the at least one of the client computers sends a subsequent one of the deltas; and
when the feedback indicates that the first one of the deltas was rejected, the at least one of the client computers waits for deltas from the one or more others of the client computers to be received from the server computer, and then inserts the deltas from the one or more other of the client computers into the history maintained by the at least one of the client computers ahead of any local ones of the deltas waiting to be transmitted to the server computer and reconciles the deltas from the one or more other of the client computers and the local ones of the deltas.

* * * * *